(12) United States Patent
Williams et al.

(10) Patent No.: US 6,407,641 B1
(45) Date of Patent: Jun. 18, 2002

(54) AUTO-LOCKING OSCILLATOR FOR DATA COMMUNICATIONS

(75) Inventors: Timothy J. Williams, Bellevue; Jeffrey D. Wick, Snohomish, both of WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/511,019

(22) Filed: Feb. 23, 2000

(51) Int. Cl.$^7$ .............................................. H03L 7/099
(52) U.S. Cl. ...................... 331/1 A; 331/25; 327/159; 327/160; 375/376; 375/373
(58) Field of Search ................................. 375/376, 373; 331/25, 1 A, 1 R; 327/159, 160

(56) References Cited

U.S. PATENT DOCUMENTS

| | | | |
|---|---|---|---|
| 4,061,987 A | 12/1977 | Nagahama | 331/111 |
| 4,272,760 A | 6/1981 | Prazak et al. | 340/347 |
| 4,344,067 A | 8/1982 | Lee | 340/347 |
| 4,689,740 A | 8/1987 | Moelands et al. | 364/200 |
| 4,692,718 A | 9/1987 | Roza et al. | 331/113 R |
| 4,855,683 A | 8/1989 | Troudet et al. | |
| 4,868,525 A | 9/1989 | Dias | 331/111 |
| 4,947,169 A | 8/1990 | Smith et al. | 341/121 |
| 5,140,197 A | 8/1992 | Grider | 307/480 |
| 5,150,079 A | 9/1992 | Williams et al. | 331/75 |
| 5,175,884 A | 12/1992 | Suarez | 455/260 |
| 5,200,751 A | 4/1993 | Smith | 341/147 |
| 5,304,955 A | 4/1994 | Atriss et al. | 331/1 R |
| 5,319,370 A | 6/1994 | Signore et al. | 341/120 |
| 5,381,116 A | 1/1995 | Nuckolls et al. | 331/1 A |
| 5,420,543 A | 5/1995 | Lundberg et al. | 331/1 A |
| 5,428,319 A | 6/1995 | Marvin et al. | 331/176 |
| 5,440,305 A | 8/1995 | Signore et al. | 341/120 |
| 5,446,867 A | 8/1995 | Young et al. | 395/550 |
| 5,473,285 A | 12/1995 | Nuckolls et al. | 331/1 A |
| 5,495,205 A | 2/1996 | Parker et al. | 331/1 A |
| 5,506,875 A | 4/1996 | Nuckolls et al. | 375/375 |

(List continued on next page.)

FOREIGN PATENT DOCUMENTS

| | | | | |
|---|---|---|---|---|
| WO | WO 96/17305 | 6/1996 | | G06F/13/40 |
| WO | WO 98/34376 | 6/1998 | | H04L/12/20 |
| WO | WO 99/09712 | 2/1999 | | H04L/12/40 |

OTHER PUBLICATIONS

A 30–MHz Hybrid Analog/Digital Clock Recovery Circuit in 2–μm CMOS, By: Beomsup Kim et al., Journal of Solid–State Circuits, vol. 25, No. 6, Dec. 1990, pp. 1385–1394.
WP 3.5: An Integrated Time Reference, By: Robert A. Blauschild, ISSCC94/Session 3, Analog Techniques/Paper WP 3.5, 1994.
Micropower CMOS Temperature Sensor with Digital Output, By: Anton Bakker et al., 1996 IEEE.
An Analog PLL–Based Clock and Data Recovery Circuit with High Input Jitter Tolerance, By: Sam Yinshang Sun, Reprinted from IEEE Journal of Solid–State Circuits, vol. SC–24, pp. 325–330, Apr. 1989.
CY7C63722/23 CY7C63742/43 enCoRe™ USB Combination Low–Speed USB & PS/2 Peripheral Controller, Cypress Semiconductor Corp., Feb. 2000—Revised Apr. 11, 2000, pp. 1–51.
CY7C63221/31 en CoRe™ USB Low Speed USB Peripheral Controller, Cypress Semiconductor Corp., Feb. 2000—Revised Apr. 11, 2000, pp. 1–43.

*Primary Examiner*—Arnold Kinkead
(74) *Attorney, Agent, or Firm*—Christopher P. Maiorana, P.C.

(57) ABSTRACT

A method for tuning the frequency of oscillation of a clock signal, comprising the steps of (A) analyzing the rate of an incoming data stream to generate one or more control signals and (B) adjusting said frequency of oscillation in response to said one or more control signals.

16 Claims, 10 Drawing Sheets

U.S. PATENT DOCUMENTS

| | | |
|---|---|---|
| 5,511,100 A | 4/1996 | Lundberg et al. .......... 375/376 |
| 5,546,433 A | 8/1996 | Tran et al. ................. 375/376 |
| 5,552,748 A | 9/1996 | O'Shaughnessy ........... 331/1 A |
| 5,559,502 A | 9/1996 | Schutte ................. 340/825.21 |
| 5,563,553 A | 10/1996 | Jackson ....................... 331/57 |
| 5,565,819 A | 10/1996 | Cooper ....................... 331/111 |
| 5,583,501 A | 12/1996 | Henrion et al. ............. 341/118 |
| 5,594,612 A | 1/1997 | Henrion ...................... 341/120 |
| 5,604,466 A | 2/1997 | Dreps et al. ............ 331/113 R |
| 5,666,118 A | 9/1997 | Gersbach .................... 341/120 |
| 5,668,506 A | 9/1997 | Watanabe et al. ............. 331/66 |
| 5,670,915 A | 9/1997 | Cooper et al. .............. 331/111 |
| 5,673,004 A | 9/1997 | Park .......................... 331/1 A |
| 5,682,049 A | 10/1997 | Nguyen ....................... 257/363 |
| 5,686,863 A | 11/1997 | Whiteside ................... 330/260 |
| 5,689,196 A | 11/1997 | Schutte ........................ 326/86 |
| 5,726,597 A | 3/1998 | Petty et al. ................. 327/307 |
| 5,796,312 A | 8/1998 | Hull et al. .................... 331/44 |
| 5,805,909 A | 9/1998 | Diewald ................ 395/750.04 |
| 5,818,370 A | 10/1998 | Sooch et al. ................ 341/120 |
| 5,825,317 A | 10/1998 | Anderson et al. ........... 341/120 |
| 5,898,345 A | 4/1999 | Namura et al. ......... 331/177 V |
| 6,211,739 B1 | 4/2001 | Snyder et al. ............. 331/1 A |
| 6,215,835 B1 * | 4/2001 | Kyles ......................... 375/376 |
| 6,297,705 B1 | 10/2001 | Williams et al. .............. 331/44 |

* cited by examiner

| CALC | CLOCK ERR | BIT TIMES | NOMINAL TIME | NEXT/PAIR | INCLUDES OSC JITTER | | CLK: 48 MHz | |
|---|---|---|---|---|---|---|---|---|
| | | | | | MIN TIME | MAX TIME | MIN COUNT | MAX COUNT |
| A | 0.00% | 4 | 2667 | PAIR | 2644 | 2690 | 126 | 130 |
| B | 2.00% | 4 | 2667 | PAIR | 2644 | 2690 | 124 | 132 |
| C | 5.00% | 4 | 2667 | PAIR | 2644 | 2690 | 120 | 136 |
| D | 9.00% | 4 | 2667 | PAIR | 2644 | 2690 | 115 | 141 |
| E | 9.00% | 3 | 2000 | NEXT | 1938 | 2062 | 84 | 108 |
| F | 9.00% | 5 | 3333 | NEXT | 3271 | 3395 | 142 | 178 |
| G | 0.00% | 20 | 13333 | NEXT | 13271 | 13395 | 637 | 643 |
| H | 1.86% | 20 | 13333 | NEXT | 13271 | 13395 | 625 | 655 |
| J | 2.00% | 19 | 12667 | PAIR | 12644 | 12690 | 594 | 622 |
| K | 2.00% | 21 | 14000 | PAIR | 13977 | 14023 | 657 | 687 |
| L | 2.00% | 21 | 14000 | PAIR | 13977 | 14023 | 657 | 687 |
| M | 2.00% | 20 | 13333 | PAIR | 13310 | 13356 | 626 | 654 |
| N | 2.00% | 19 | 12667 | NEXT | 12605 | 12729 | 592 | 624 |
| O | 2.00% | 21 | 14000 | NEXT | 13938 | 14062 | 655 | 689 |
| P | 1.86% | 21 | 14000 | NEXT | 13938 | 14062 | 656 | 688 |

FIG. 4

| INITIAL CLOCK ERR | BIT TIMES | TUNING TRIM: 1X IMPROVEMENT | | | | TUNING TRIM: 10X IMPROVEMENT | | | |
|---|---|---|---|---|---|---|---|---|---|
| | | MAX ERR @ 24MHz | | MAX ERR @ 48MHz | | MAX ERR @ 24MHz | | MAX ERR @ 48MHz | |
| | | MINSPEED | MAXSPEED | MINSPEED | MAXSPEED | MINSPEED | MAXSPEED | MINSPEED | MAXSPEED |
| 0.00% | 4 | 2.2% | 3.1% | 1.9% | 2.6% | 2.0% | 2.2% | 1.6% | 1.8% |
| 2.00% | 4 | 3.1% | 3.5% | 2.8% | 3.0% | 2.1% | 2.1% | 1.7% | 1.7% |
| 3.00% | 4 | 3.4% | 3.9% | 3.0% | 3.2% | 2.0% | 2.3% | 1.7% | 1.7% |
| 4.00% | 4 | 3.8% | 4.8% | 3.3% | 4.1% | 2.2% | 2.3% | 1.7% | 2.0% |
| 5.00% | 4 | 3.8% | 4.8% | 4.0% | 4.3% | 2.2% | 2.3% | 1.9% | 1.9% |
| 6.00% | 4 | 4.7% | 5.2% | 4.2% | 4.5% | 2.2% | 2.3% | 1.8% | 1.9% |
| 8.00% | 4 | 5.1% | 6.1% | 4.8% | 5.6% | 2.2% | 2.5% | 1.8% | 2.1% |
| 0.00% | 20 | 1.0% | 1.2% | 1.0% | 1.3% | 1.0% | 1.0% | 0.8% | 1.0% |
| 1.00% | 20 | 1.5% | 1.7% | 1.4% | 1.7% | 1.0% | 1.0% | 0.9% | 1.0% |
| 1.25% | 20 | 1.7% | 1.9% | 1.7% | 1.9% | 1.0% | 1.1% | 1.0% | 1.1% |
| 1.50% | 20 | 1.9% | 2.1% | 1.9% | 1.7% | 1.1% | 1.2% | 1.1% | 0.9% |
| 1.75% | 20 | 2.0% | 2.2% | 1.6% | 1.9% | 1.1% | 1.2% | 1.0% | 1.0% |
| 2.00% | 20 | 2.0% | 2.2% | 1.9% | 1.8% | 1.1% | 1.2% | 1.0% | 1.0% |
| 2.25% | 20 | 1.7% | 1.9% | 2.1% | 1.9% | 1.1% | 1.1% | 1.0% | 1.0% |

AUTO-LOCKING OSCILLATOR FOR DATA COMMUNICATIONS

CROSS REFERENCE TO RELATED APPLICATION

The present application may relate to application Ser. No. 09/511,202, filed Feb. 23, 2000, now U.S. Pat. No. 6,297,705, which is hereby incorporated by reference in its entirety.

FIELD OF THE INVENTION

The present invention relates to a method and/or architecture for data communications generally and, more particularly, to a method and/or architecture for auto-locking the frequency of an oscillator to a multiple of the rate of an incoming data stream.

BACKGROUND OF THE INVENTION

Conventional communication circuits require a precision timing component to supply a reference frequency to an external device. The chip either uses such a reference frequency as is, or further tunes the frequency to match the data rate of incoming data. Conventional Phase Lock Loop (PLL) and/or Delay Lock Loop (DLL) circuits may be used to lock to such data rates, sometimes requiring long data "training" sequences. Conventional approaches that use a local fixed reference frequency typically do some phase shifting or phase selection to sample incoming data since the clock rate between the internal clock and the external clock typically differ.

Precision timing elements used in such circuits are crystals, resonators etc. Interfacing to the timing element requires one or two pins of the chip, which adds to the overall cost of the chip. Precision timing elements also require additional inventory and board space. Internally based timers (e.g., PLLs) typically require long training sequence to tune a PLL/DLL, which may not be available in modern applications, such as Universal Serial Bus (USB) applications.

SUMMARY OF THE INVENTION

The present invention concerns a method for tuning the frequency of oscillation of a clock signal, comprising the steps of (A) analyzing the rate of an incoming data stream to generate one or more control signals and (B) adjusting said frequency of oscillation in response to said one or more control signals.

The objects, features and advantages of the present invention include providing a method and/or architecture for auto-locking the frequency of an oscillator with a data rate of an incoming data stream that may (i) be used in a data communication device, (ii) precisely lock to an incoming data rate without an external precision timing element, (iii) analyze incoming data traffic to provide precision timing, (iv) provide 1% (or greater) accuracy without an external timing element, and/or (v) provide a precise oscillator without requiring pins to interface to the chip.

BRIEF DESCRIPTION OF THE DRAWINGS

These and other objects, features and advantages of the present invention will be apparent from the following detailed description and the appended claims and drawings in which:

FIGS. 6(a–d) are graphs illustrating an output of the present invention; and

DETAILED DESCRIPTION OF THE PREFERRED EMBODIMENTS

Figure 1:
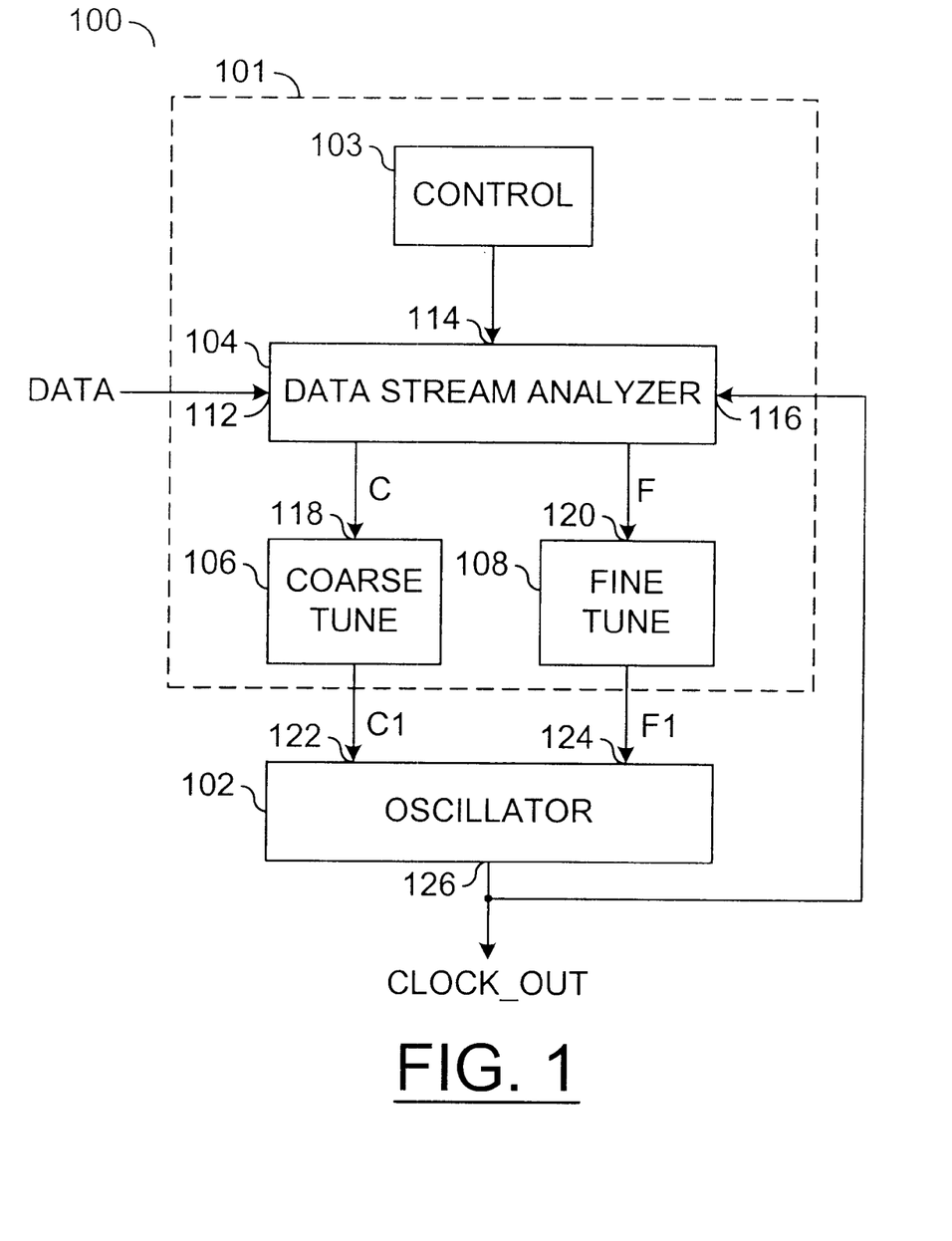
FIG. 1 is a block diagram of a preferred embodiment of the present invention.

Referring to FIG. 1, a block diagram of a circuit 100 is shown in accordance with a preferred embodiment of the present invention. The structure of the circuit 100 generally comprises a tuning circuit 101 and an oscillator circuit 102. The tuning circuit 101 generally comprises a control circuit 103, a data stream analyzer circuit 104, a coarse tune circuit 106, and a fine tune circuit 108. The data stream analyzer circuit 104 may have an input 112 that may receive an incoming data stream (e.g., DATA), an input 114 that may receive a signal from the control circuit 103 and an input 116 that may receive a clock signal (e.g., CLOCK_OUT). The data stream analyzer circuit 104 may present a control signal (e.g., C) to an input 118 of the coarse tune circuit 106 and a control signal (e.g., F) to an input 120 of the fine tune circuit 108. The coarse tune circuit 106 may present a control signal (e.g., C1) to an input 122 of the oscillator 102 and a control signal (e.g., F1) to an input 124 of oscillator circuit 102. The oscillator circuit 102 may have an output 126 that may present the signal CLOCK_OUT. The control signals C, F, C1 and F1 may be multi-bit signals. The signal DATA may be a series of packets that may not necessarily be sequential. For example, the signal DATA may be bursty.

The circuit 100 may enable a device to quickly and automatically lock onto the data rate of an incoming data signal DATA without using an external precision timing component (e.g., without a crystal, resonator, etc.). The main components of the circuit 100 are the programmable oscillator 102 and the tuning circuit 101. The circuit 100 may be used to tune the oscillator 102 based on measurements of the data rates of the incoming data signal DATA.

The present invention may eliminate external precision timing devices by quickly locking the oscillator 102 to the rate of incoming data signal DATA. The circuit 100 may provide a ~1% accurate oscillator by tuning/locking to, in one example, low-speed USB traffic. The present invention may provide a method that may tune the oscillator 102 to match a multiple of the USB traffic data rate. The tuning may occur on every token packet, and may include, in one example, a coarse and fine tuning to achieve the desired accuracy from an initial clock having an error of 5% or more. Trimming the initial state of the oscillator 102 may require two calibration numbers to be acquired. One calibration number may set the gain (e.g., step-size). Another calibration number may set an offset (e.g., a frequency). The gain is described in more detail in connection with FIGS. 5, 6 and 7.

Figure 2:
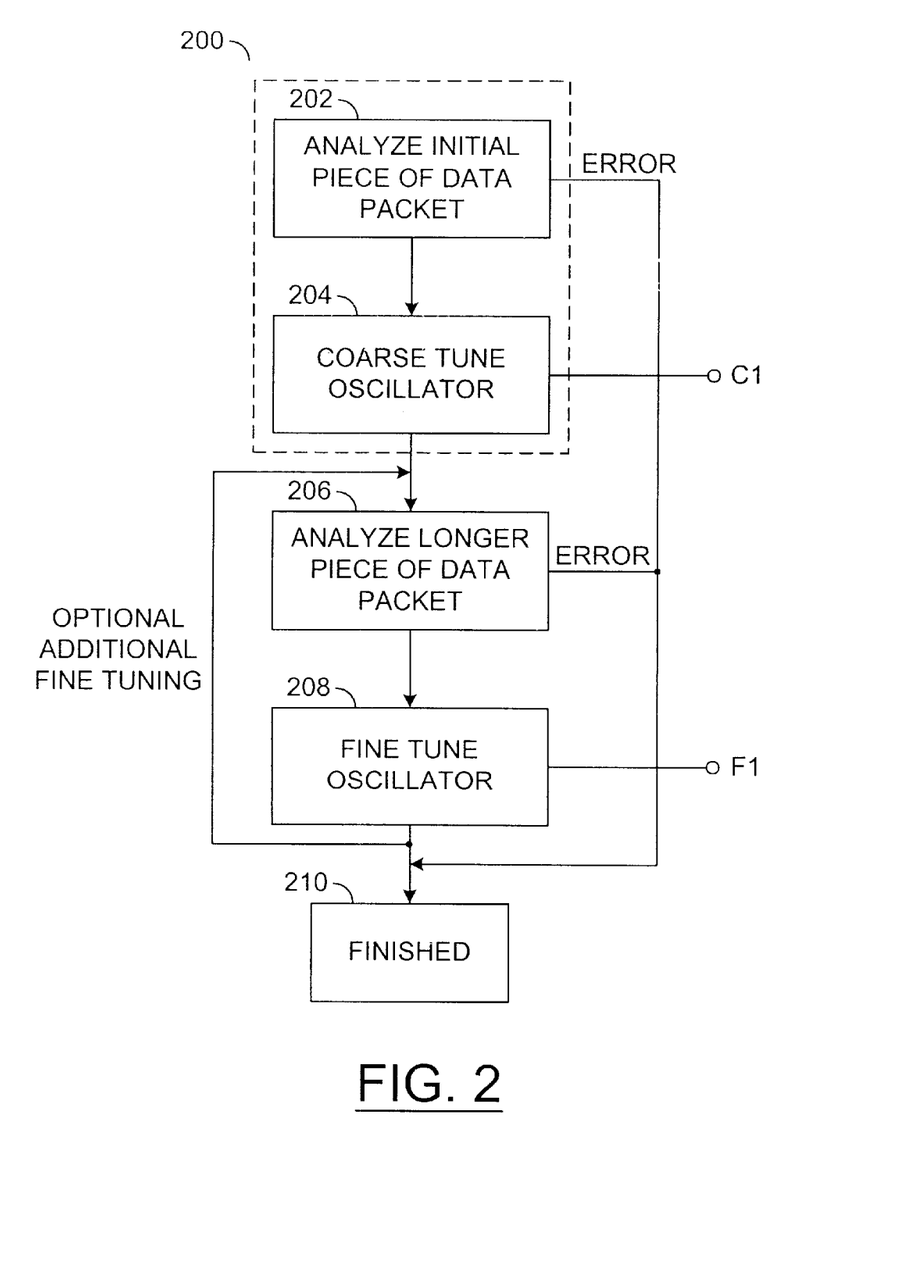
FIG. 2 is a flow diagram of a tuning method in accordance with a preferred embodiment of the present invention.

Referring to FIG. 2, an example of a method 200 is shown in accordance with the present invention. The method 200 generally comprises a block 202, a block 204, a block 206, a block 208 and a finished block 210. The block 202 generally analyzes the incoming data stream DATA. If an error condition occurs, the method 200 continues to the finished block 210. If an error does not occur, the method proceeds to the block 204. The block 204 may provide a coarse tuning value C1 that may be presented to the oscillator 102. The block 206 may analyze the incoming data stream DATA for a longer period of time than the block 202. If an error condition occurs, the method 200 proceeds to the block 210. If an error condition does not occur, the method proceeds to the fine tune block 208. The fine tune block 208 presents the signal F1 to the oscillator 102. In one example, a number of blocks 206 and 208 may be implemented to provide additional fine tuning of the circuit 100. Also, the coarse tuning block 204 and the block 202 may be optional components and may not be needed in particular design implementations.

Relevant timing requirements are shown in the following TABLE 1 for various USB device types (See sections 7.1.11 and 7.1.15 of the Universal Serial Bus Specification, version 1.1, which is hereby incorporated by reference in its entirety):

TABLE 1

| Source | Data Rate Tolerance |
| --- | --- |
| Host/Hub/Full-speed Function | +0.25% |
| Low-Speed Function | +1.5% |

In USB applications the circuit 100 must generally operate with a 1.5% accuracy, even when locking to a 0.25% accurate input data rate. In such applications the circuit 100 must lock within 1.25% of the input data rate.

The circuit and method of the present invention generally use a reasonably precise internal clock that may be calibrated using the rate of the incoming data signal DATA. As a particular packet arrives, the error in the internal clock is measured, and then corrected as needed for the outgoing packet response. Many other implementations are possible. For example, the present invention may provide a coarse tuning, then fine tuning on each token packet of the signal DATA to continuously tune the frequency of oscillation of the signal OUT.

The early part of each of the packets of the signal DATA generally contain data edges every bit time and may be used for coarse tuning. The coarse tuning circuit 106 may correct a 5–10% accurate clock to within 2%. After coarse tuning, an edge present at a bit position late in the token packet may provide a calibration mark for the fine tuning circuit 108. An oversampling internal clock (e.g., oscillator 102) may drive counters (not shown) within the data stream analyzer circuit 104 that are started and stopped by the relevant edges of the USB traffic. Such counters may result in count values that may provide correction terms used to tune the frequency of oscillation of the signal OUT. An example of such counters may be found in the previously referenced co-pending application.

The coarse tuning may be necessary to ensure that a reference edge late in the packet may be clearly distinguished from possible edges that are only one bit time away from the reference edge. The coarse tuning may also guarantee that the clock for a Serial Interface Engine (SIE) data recovery is accurate enough for proper operation.

Figure 3:
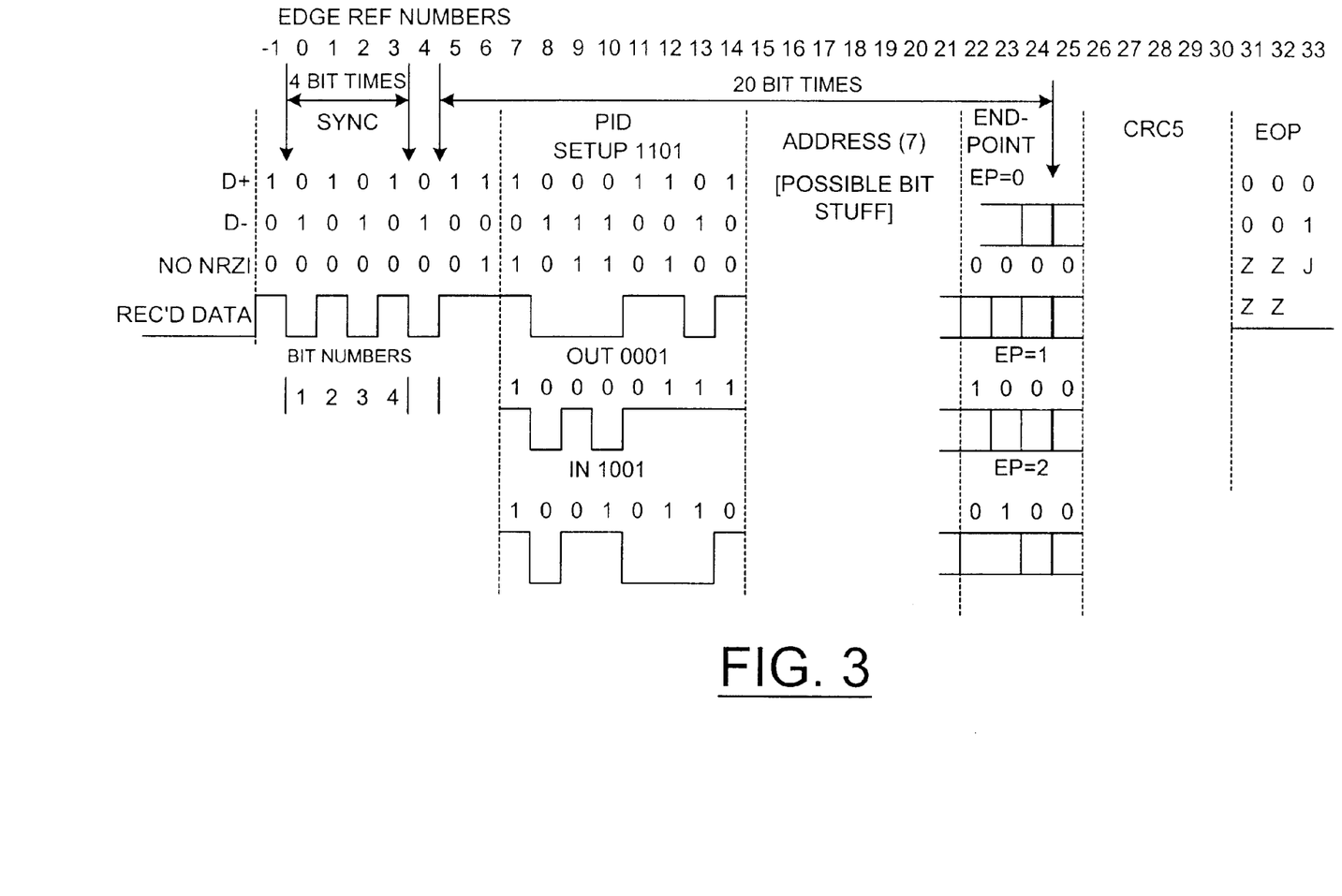
FIG. 3 is a table illustrating a configuration of a token packet of the present invention.

Referring to FIG. 3, an example of low speed data bit times are shown every 667 ns (1.5 Mb/s). In the USB NRZI format, a '0' is generally transmitted by a (differential) data edge, while a '1' has no edge. After 6 consecutive 1's, a 0 may be automatically inserted (e.g., by "bit stuffing") into the data stream.

One bit stuff may be possible in a token packet, generally occurring due to a long string of 1's in the address field. FIG. 3 illustrates the bit locations where edges will generally occur. Because of the possible bit stuff, the edges after the address field may occur one bit time later.

The first edge may have skew and will generally only be used to arm the tuning circuits. The Sync field may provide reliable edges at the beginning of the packet. An edge generally occurs at Edge #25, even if a bit stuff occurs, (since edges always occur at both #24 and #25 with no bit stuff). While the EOP generally provides a unique signal late in the packet (e.g., SE0), the jitter on this edge may not give a sufficiently accurate reference, particularly with the possible bit stuff.

In one example, the internal clock may run at a multiple of 6 MHz and may be divided down to 6 MHz to provide the basic chip clock. Exemplary candidate frequencies are 24 MHz and 48 MHz. A higher frequency may give more counts and may provide better resolution in a given time interval. However, such resolution may be achieved at the expense of more difficult implementation and may possibly increase error from oscillator variation over process due to the more significant time delay of the comparator circuits. A 24 MHz or 48 MHz clock may provide a 16× or 32× oversample of the incoming data stream DATA.

The proposed tuning method may be implemented as follows, based on a 16× oversample with a 24 MHz clock (i) the data stream analyzer circuit 104 idles during idle time, (ii) the first edge (#−1) arms counters, (iii) at Edge #0, Counter A starts (clocked by the ~24 MHz clock), (iv) at Edge #4, Counter A is halted and the ideal count will be 64, (v) the oscillator tune value is updated between Edges #4 and #5, if necessary (the clock must now be within about +2% accurate in order to distinguish between edges after 19, 20, and 21 bit times (to be discussed in more detail in connection with FIGS. 4–7)), (vi) at Edge #5, Counter B starts, (vii) at Edge #25, Counter B is halted (the ideal count is 20×16=320, this edge may be detected either by using a valid count range, or by using the SIE to isolate this edge) and (viii) the residue from the ideal 320 is used to tune the oscillator 102 to the final value, now to within 1%.

The internal oscillator 102 may be implemented to generate a clock signal to cover the 12–16 MHz range. The oscillator 102 may only need to be able to reach the fixed frequency of, for example, 24 MHz. The oscillator 102 may be, in one example, tunable between a minimum and a maximum setting in 256 total steps, using an 8-bit trim register.

While the present invention is relatively insensitive to temperature and voltage variation, it may have variation with process corners. The following TABLE 2 illustrates a simulated performance of an example of the oscillator 102. Measured frequencies used for minimum and maximum settings were 7 MHz and 20 MHz.

TABLE 2

| Corner | Min Freq (MHz @ Trim = 0) | Max Freq (MHz @ Trim = 255) | Approx Step Size (kHz) |
| --- | --- | --- | --- |
| Slow | 6.3 | 16.3 | 39 |
| Typical | 8.2 | 21 | 50 |
| Fast | 10.9 | 28 | 67 |

TABLE 2 indicates that over corners, the frequency may vary by about 1.75:1 at a given trim setting. The minimum to maximum frequency may also be adjustable. The oscillator 102 may need to only reach 24 (or 48) MHz. For margin, the oscillator 102 may be tunable over a 22–26 MHz range. Using this range and the 2.0:1 ratio, the following TABLE 3 illustrates a typical target specifications for the oscillator 40. The resulting ideal step sizes (using 255 steps) are listed.

TABLE 3

| Corner | Min Freq (MHz @ Trim = 0) | Max Freq (MHz @ Trim = 255) | Approx Step Size (kHz @ 24 MHz) | Approx Step Size (kHz @ 6 MHz) |
|---|---|---|---|---|
| Slow | 11 | 26 | 59 | 15 |
| Typical | 15.5 | 36.6 | 82 | 21 |
| Fast | 22 | 52 | 117 | 29 |

For 1.25% final accuracy, the frequency error at 6 MHz is generally within ±75 kHz. As shown in TABLE 3, such error is achievable as long as the calibration process can bring the oscillator to within ±2 to 5 counts of the ideal value.

Figure 4:
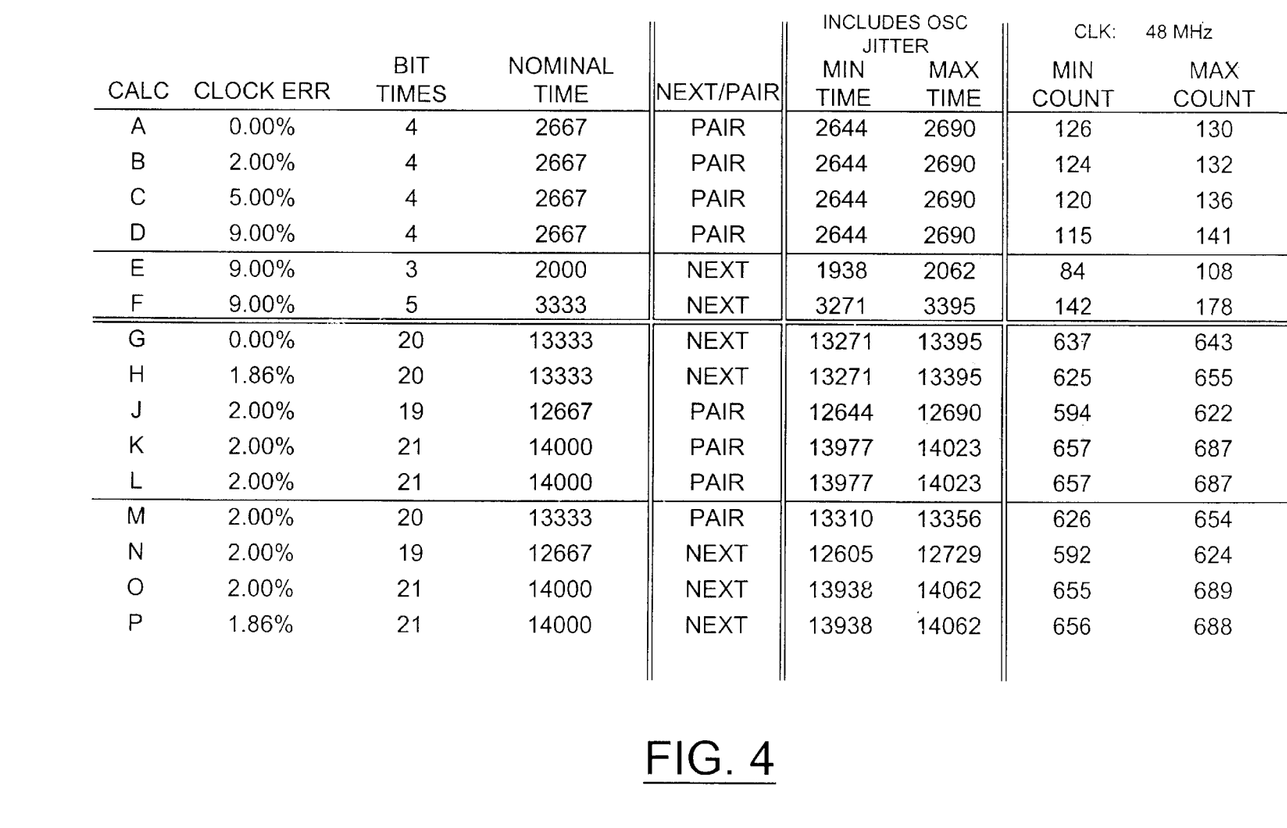
FIG. 4 is a table illustrating an operation of the present invention.

Referring to FIG. 4, a table illustrating the output of the circuit 100 is shown. For the coarse tune circuit 106, there is not generally a window issue over 4 bit times, even at a 9% clock error. In such a case, the minimum/maximum counts are shown as 115 and 141. The count at 3 bit times is generally 108 or less. The count at 5 bit times is generally 142 or more. At a 10% clock error, there may be overlap in the count window. As noted above, the fixed 4 edges may be used to ignore the window problem in the coarse tune, with the constraint that the result of the coarse tune has a close enough tolerance for proper fine tuning.

For the fine tune across 20 bit times, the error is generally <1.86% to avoid window issues. Lines H–L illustrate that the signal OUT is within 1.86% to establish a unique 20th bit time edge in the 625–655 count range. Lines M–P show essentially the same thing, with the 20-bit edge being a paired edge instead of a next edge. In the example illustrated, the count overlaps occur at 1.87%.

An alternative implementation of the fine tuning may be to have the SIE indicate the location of the 20th edge in the fine tuning step. Such an implementation (including properly handling the possible bit-stuff), may simplify the requirements somewhat. However, the data recovery should function properly. The data recovery may use a 4× oversampling method that may constantly shift the clock phase to track the incoming data stream. For proper operation, the data recovery should not experience a 180-degree phase shift between two data edges. In one example, the data edges may not shift by more than ¼ bit time relative to the internal clock.

In one example, 7 bit times may occur with no edge. With 'Next' edge jitter, the 7 bit times +7 bit time errors may occur due to clock error and/or jitter. The shift may be the sum of the last two terms and may be illustrated, in one example, as follows:

Bit Time/4>7*(Bit Time Error)+jitter
667 ns/4>7*(bit time error)+59 ns or
Bit Time Error <15.4 ns, which is 2.3% of an ideal bit time. The clock must normally be within 2.3% after the coarse tuning to use the SIE edge-locating approach.

Figure 5:
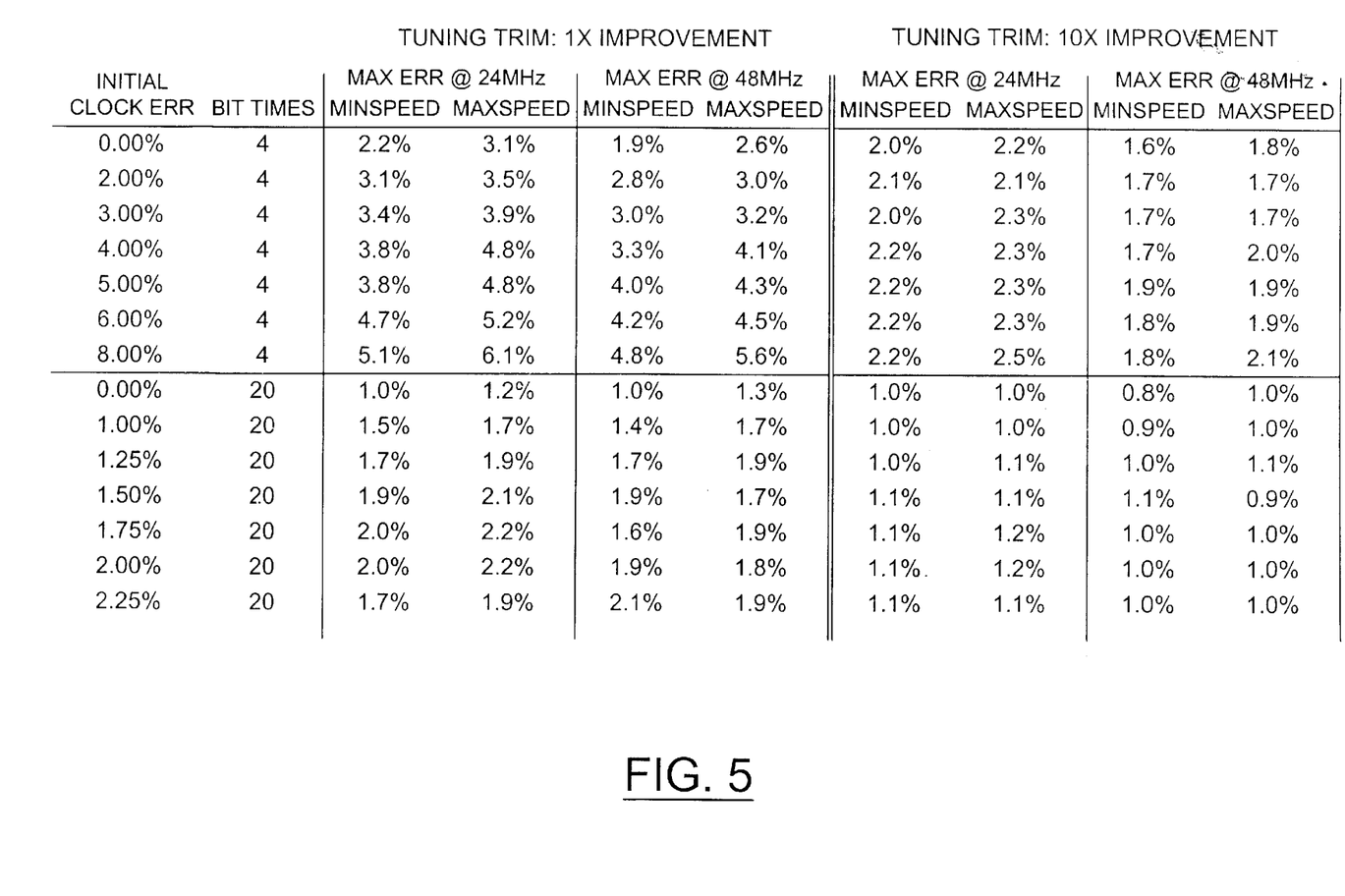
FIG. 5 is a table illustrating an operation of the present invention.
Figure 6A:
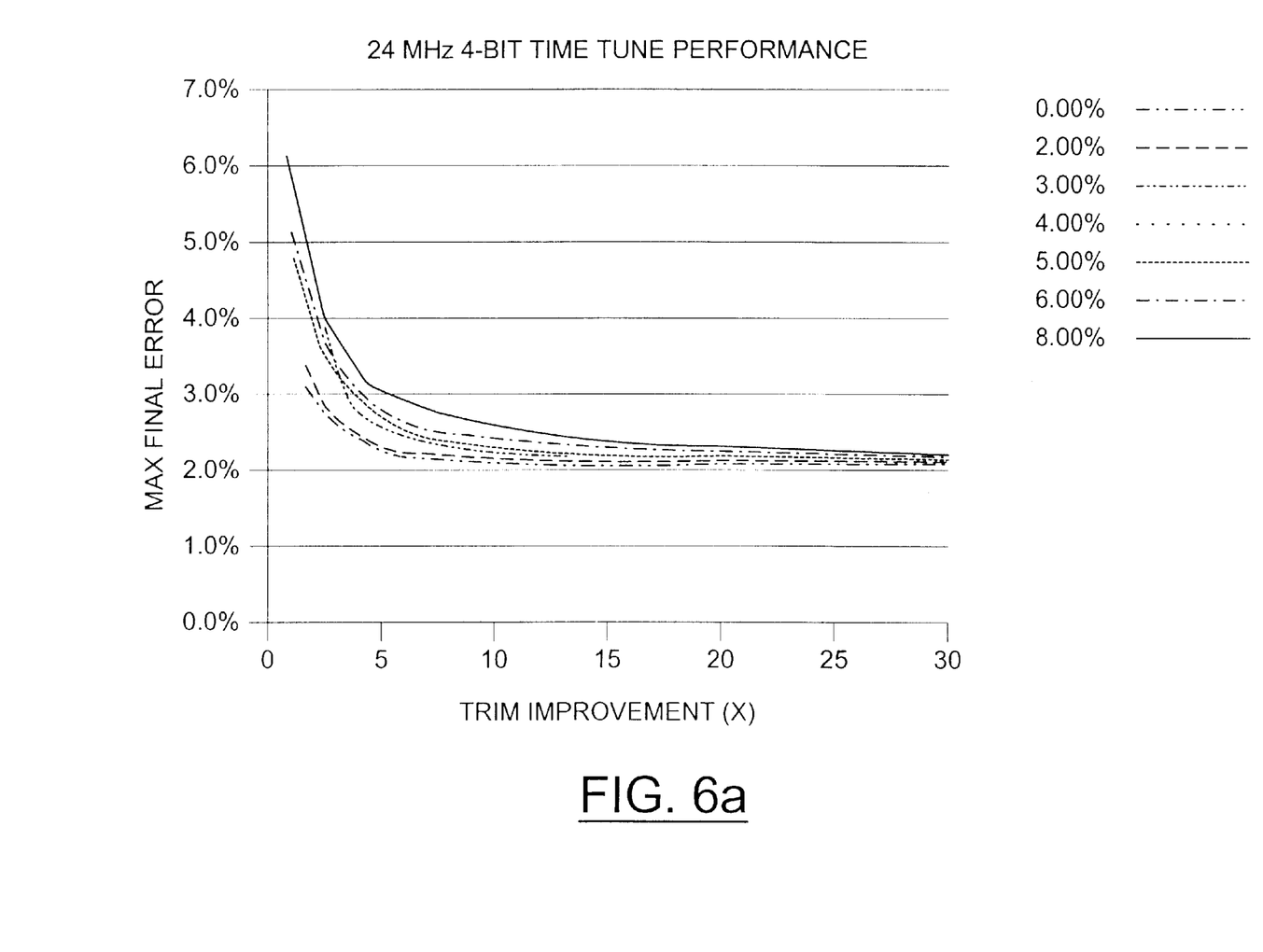
Figure 6B:
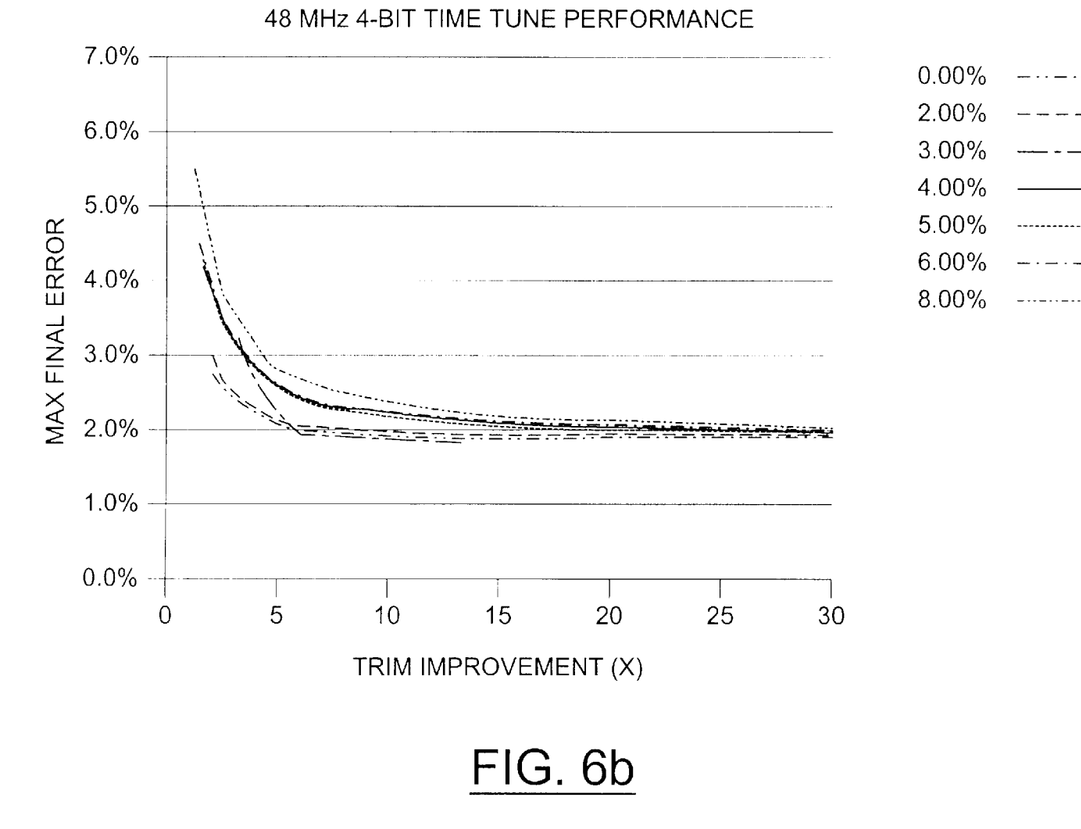
Figure 6C:
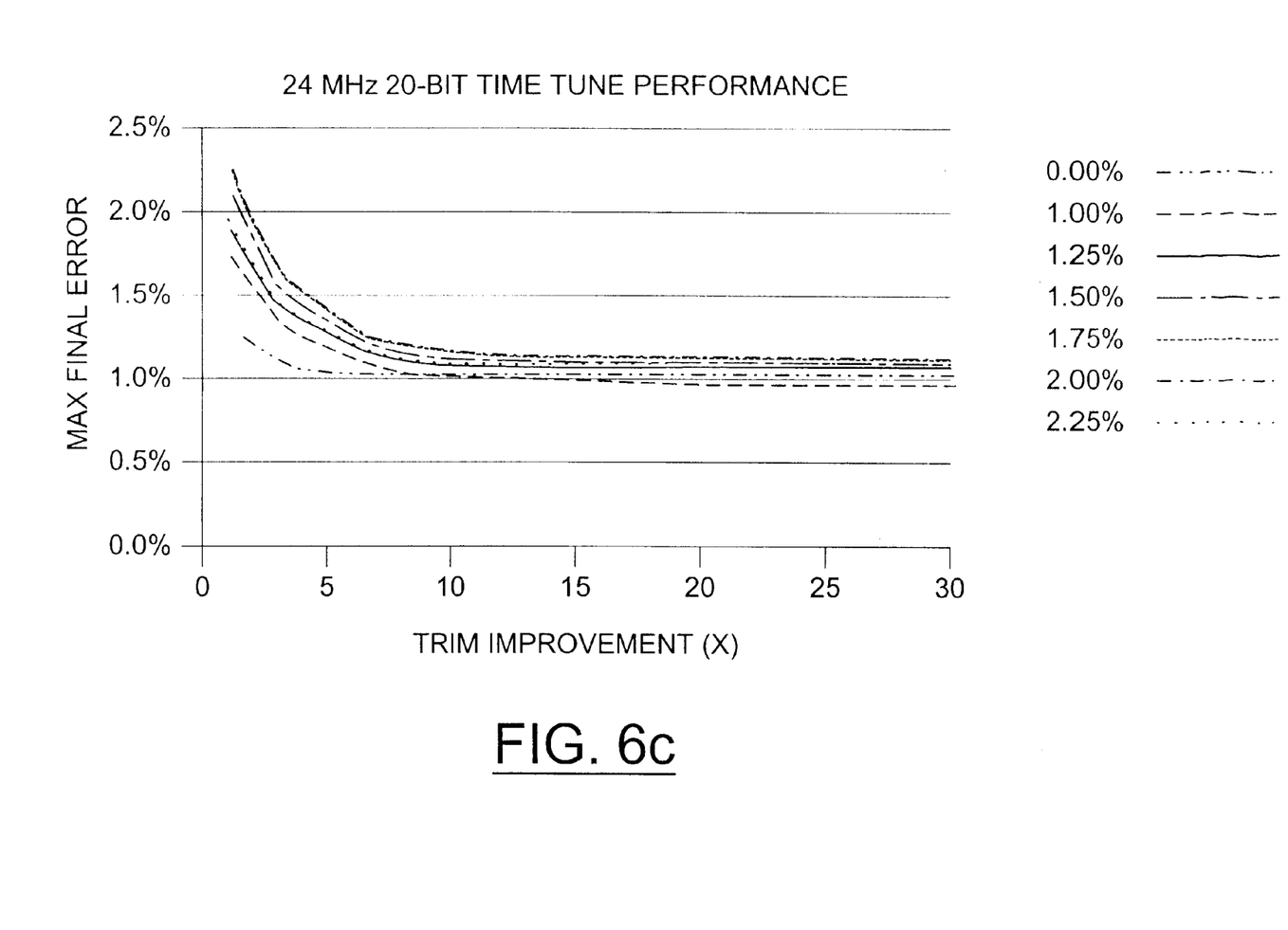
Figure 6D:
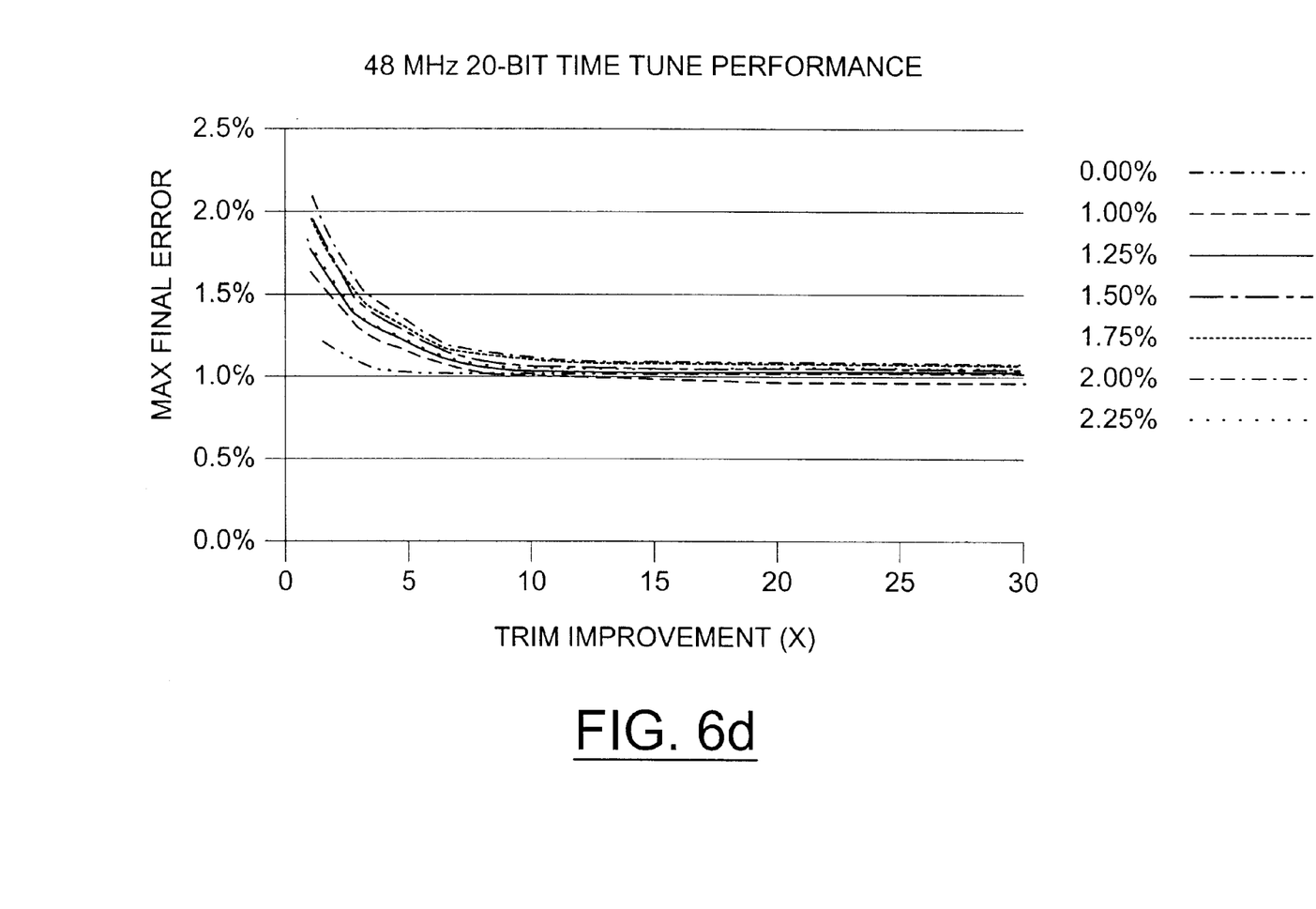

Referring to FIG. 5, a table illustrating an example of a final accuracy requirement is shown. The coarse tune circuit 106 may achieve ~2.0% accuracy and the fine tune circuit 108 may achieve 1.25% accuracy. FIG. 5 summarizes the analysis results with the 24 MHz and 48 MHz example. Two trim settings are shown illustrating 1× and 10× improvements. Both coarse (e.g., 4 bit times) and fine (e.g., 20 bit times) tuning are shown. An exemplary set of initial clock errors are shown, up to 8% for the coarse tune and 2.25% for the fine tune.

An untrimmed case (e.g., 1× improvement) shows that the initial step size in the programmable oscillator 102 may not achieve the desired accuracies. However, a 10× trimmed improvement toward an ideal step size may meet the requirements for final clock accuracy with a 48 MHz clock, but may be marginal at 24 MHz. The final error does not monotonically increase with increasing initial error, due to rounding/quantizing error that naturally occur at some of the steps.

Figure 7:
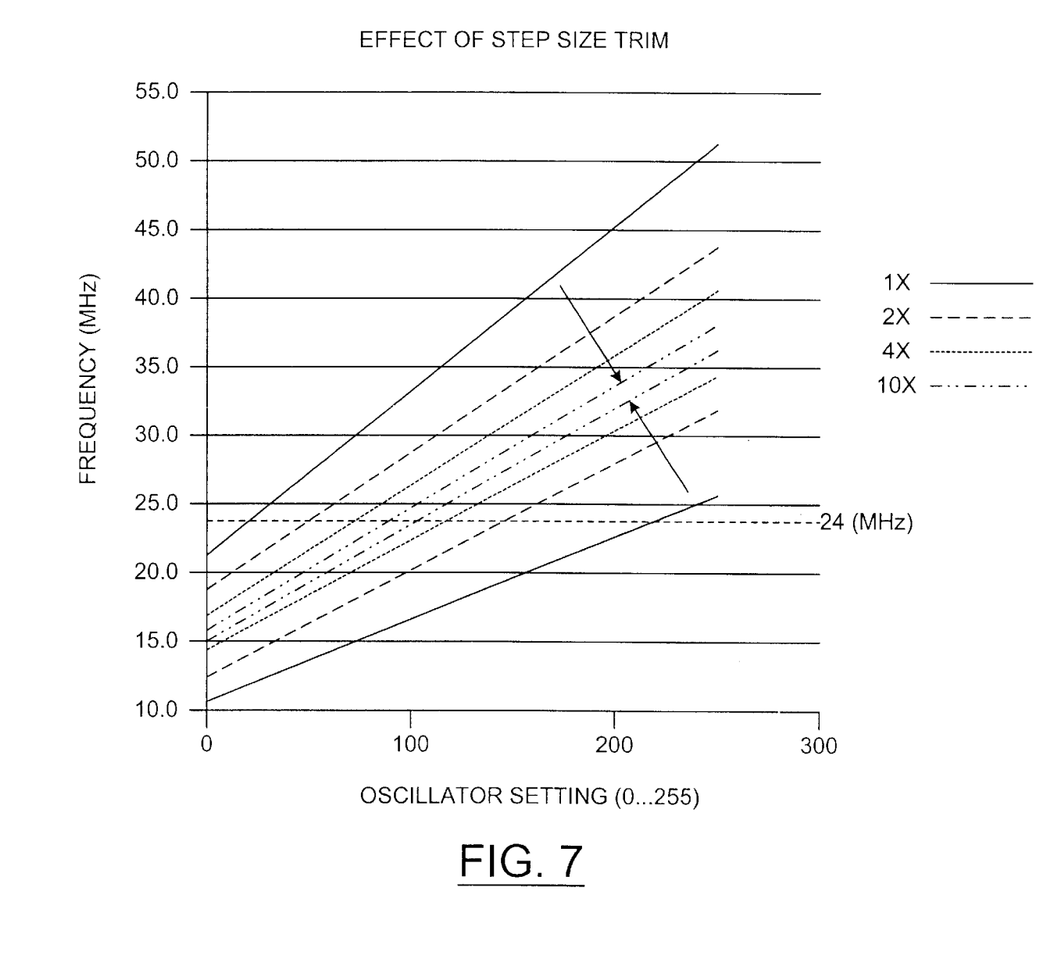
FIG. 7 is a chart illustrating an operation of the present invention.

Referring to FIGS. 6(a–d), the relationship between final error and trim setting is shown. The trim benefit may flatten out for improvements beyond ~10×, which is normally achieved by a 4-bit trim. FIG. 7 is a graph of a typical effect of step size trim of the present invention.

The present invention may provide a sufficiently accurate clock for USB transmission. Many variations of the present invention are contemplated. For example, the coarse/fine tune intervals may be chosen to meet the design criteria of a particular implementation. The reference edge 25 has been described as an example of end mark and may be varied. With an accurate enough initial clock, the coarse tune phase may be eliminated.

While particular aspects of the present invention have been described in the context of USB applications, other applications may also be implemented. The circuit 100 may be used to achieve demanding cost targets, such as designing low-cost mouse controllers.

While the invention has been particularly shown and described with reference to the preferred embodiments thereof, it will be understood by those skilled in the art that various changes in form and details may be made without departing from the spirit and scope of the invention.

What is claimed is:

1. A method for tuning a frequency of oscillation of a clock signal, comprising the steps of:
   (A) analyzing a rate during a first period and a second period of an incoming data stream to generate two or more control signals; and
   (B) adjusting said frequency of oscillation in response to said two or more control signals.

2. The method according to claim 1, wherein one of said control signals configures a step size and another of said control signals configures an offset.

3. The method according to claim 2, wherein said step size controls a gain of an amplifier and said offset controls said frequency of oscillation.

4. The method according to claim 1, wherein said incoming data stream is part of the data stream of a Universal Serial Bus.

5. The method according to claim 1, wherein step (B) further comprises the steps of:
   providing a coarse tuning of said frequency of oscillation; and
   providing a fine tuning of said frequency of oscillation.

6. The method according to claim 5, wherein step (B) further comprises the step of:
   providing a number of fine tuning adjustments of said frequency of oscillation.

7. The method according to claim 5, wherein said incoming data stream comprises a series of data packets.

8. The method according to claim 7, wherein said coarse tuning is generated in response to an analysis of said first period of one or more of said data packets.

9. The method according to claim 7, wherein said fine tuning is generated in response to an analysis of said second period of one or more of said data packets.

10. An apparatus comprising:

an oscillator configured to generate a clock signal in response to two or more control signals; and a control circuit configured to generate said two or more control signals in response to (i) a rate during a first period and a second period of an incoming data stream and (ii) said clock signal.

11. The apparatus according to claim 10, wherein said control circuit further comprises:

a data stream analyzer circuit configured to detect said rate of said incoming data stream.

12. The apparatus according to claim 11, wherein said control circuit further comprises:

a coarse tune circuit configured to provide a coarse adjustment of a frequency of oscillation of said clock signal.

13. The apparatus according to claim 12, further comprising:

a fine tune circuit configured to provide a fine tuning of said frequency of oscillation of said clock signal, wherein said fine tuning is less than said coarse tuning.

14. The apparatus according to claim 13, wherein said coarse tuning occurs during one or more packets of said incoming data stream and said fine tuning occurs during one or more of said packets.

15. The apparatus according to claim 13, further comprising:

a plurality of said fine tuning circuits.

16. An apparatus comprising:

means for generating a clock signal in response to two or more control signals; and means for generating said two or more control signals in response to (i) a rate during a first period and a second period of an incoming data stream and (ii) said clock signal.

* * * * *